US012703622B2

(12) United States Patent
Hiraga

(10) Patent No.: US 12,703,622 B2
(45) Date of Patent: Aug. 11, 2026

(54) ELECTRONIC DEVICE, ELECTRONIC DEVICE MANUFACTURING APPARATUS, AND METHOD FOR MANUFACTURING ELECTRONIC DEVICE

(71) Applicant: KABUSHIKI KAISHA TOSHIBA, Tokyo (JP)

(72) Inventor: Hiroki Hiraga, Saitama Saitama (JP)

(73) Assignee: KABUSHIKI KAISHA TOSHIBA, Kawasaki Kanagawa (JP)

( * ) Notice: Subject to any disclaimer, the term of this patent is extended or adjusted under 35 U.S.C. 154(b) by 357 days.

(21) Appl. No.: 18/456,684

(22) Filed: Aug. 28, 2023

(65) Prior Publication Data

US 2024/0182294 A1 Jun. 6, 2024

(30) Foreign Application Priority Data

Dec. 2, 2022 (JP) ................................ 2022-193621

(51) Int. Cl.

*B81B 7/00* (2006.01)
*B81C 1/00* (2006.01)
*B81C 99/00* (2010.01)

(52) U.S. Cl.

CPC ........ *B81B 7/0038* (2013.01); *B81C 1/00285* (2013.01); *B81C 99/0025* (2013.01)

(58) Field of Classification Search

CPC ............ B81B 7/0038; B81B 2201/025; B81C 1/00285; B81C 99/0025; H01L 23/02–10; H01L 23/16–26; H01L 21/52–54; H01L 21/4803–481; H01L 21/324–3247; H10K 71/40–441

See application file for complete search history.

(56) References Cited

U.S. PATENT DOCUMENTS 5,397,897 A 3/1995 Komatsu et al.
10,767,992 B2 9/2020 Ikehashi et al.
2009/0246576 A1* 10/2009 Terazaki ............ H01M 16/006 429/430

(Continued)

FOREIGN PATENT DOCUMENTS

JP H6-74820 A 3/1994
JP 3200657 B2 8/2001

(Continued)

OTHER PUBLICATIONS

Japan Patent Office, Office Action in JP App. No. 2022-193621 (Mar. 24, 2026).

*Primary Examiner* — Shahed Ahmed
(74) *Attorney, Agent, or Firm* — Finnegan, Henderson, Farabow, Garrett & Dunner, LLP

(57) ABSTRACT

According to one embodiment, an electronic device includes a housing, a first member, an electronic element, a getter member, and a second member. The housing includes a first portion. A first gap is provided between the first portion and the first member. A space surrounded by the housing and the first member is sealed at 1 atmospheric pressure or less. The electronic element is provided in the space. The getter member is provided in the space and fixed to the first member. The second member is fixed to the first member. At least a part of the first member is provided between the getter member and the second member. A melting point of the second member is lower than a melting point of the first member.

14 Claims, 3 Drawing Sheets

(56) References Cited

U.S. PATENT DOCUMENTS

| | | | | |
|---|---|---|---|---|
| 2015/0321905 | A1* | 11/2015 | Gooch | G01J 5/20 257/433 |
| 2017/0122799 | A1* | 5/2017 | Okudo | G01J 1/0411 |
| 2019/0296754 | A1* | 9/2019 | Kriz | G04F 5/145 |
| 2020/0284582 | A1 | 9/2020 | Kaji et al. | |
| 2020/0363205 | A1 | 11/2020 | Gando et al. | |
| 2021/0381831 | A1 | 12/2021 | Gando et al. | |
| 2021/0396780 | A1 | 12/2021 | Masunishi et al. | |
| 2022/0137085 | A1 | 5/2022 | Masunishi et al. | |
| 2022/0259035 | A1 | 8/2022 | Masunishi et al. | |
| 2022/0268583 | A1 | 8/2022 | Gando et al. | |
| 2022/0276052 | A1 | 9/2022 | Hiraga et al. | |
| 2022/0326013 | A1 | 10/2022 | Miyazaki et al. | |
| 2023/0062441 | A1 | 3/2023 | Masunishi et al. | |
| 2023/0143243 | A1 | 5/2023 | Ono et al. | |
| 2024/0006267 | A1* | 1/2024 | Jiang | H01L 23/3736 |

FOREIGN PATENT DOCUMENTS

| | | | |
|---|---|---|---|
| JP | 2007-234636 | A | 9/2007 |
| JP | 2010-175304 | A | 8/2010 |
| JP | 2015-46492 | A | 3/2015 |
| JP | 2021-192012 | A | 12/2021 |
| JP | 2022-1828 | A | 1/2022 |
| JP | 2022-74658 | A | 5/2022 |
| JP | 2022-125454 | A | 8/2022 |
| JP | 2022-129691 | A | 9/2022 |
| JP | 2022-131004 | A | 9/2022 |
| JP | 2022-162641 | A | 10/2022 |
| JP | 2021-16923 | A | 2/2023 |
| JP | 2023-36260 | A | 3/2023 |
| JP | 2023-69581 | A | 5/2023 |
| JP | 2023-73684 | A | 5/2023 |

* cited by examiner

ELECTRONIC DEVICE, ELECTRONIC DEVICE MANUFACTURING APPARATUS, AND METHOD FOR MANUFACTURING ELECTRONIC DEVICE

CROSS-REFERENCE TO RELATED APPLICATIONS

This application is based upon and claims the benefit of priority from Japanese Patent Application No. 2022-193621, filed on Dec. 2, 2022, the entire contents of which are incorporated herein by reference.

FIELD

Embodiments described herein relate generally to an electronic device, an electronic device manufacturing apparatus, and a method for manufacturing an electronic device.

BACKGROUND

For example, in an electronic device, a MEMS element or the like is sealed in a decompression housing. Stable characteristics are desired in electronic devices.

DETAILED DESCRIPTION

Figure 1:
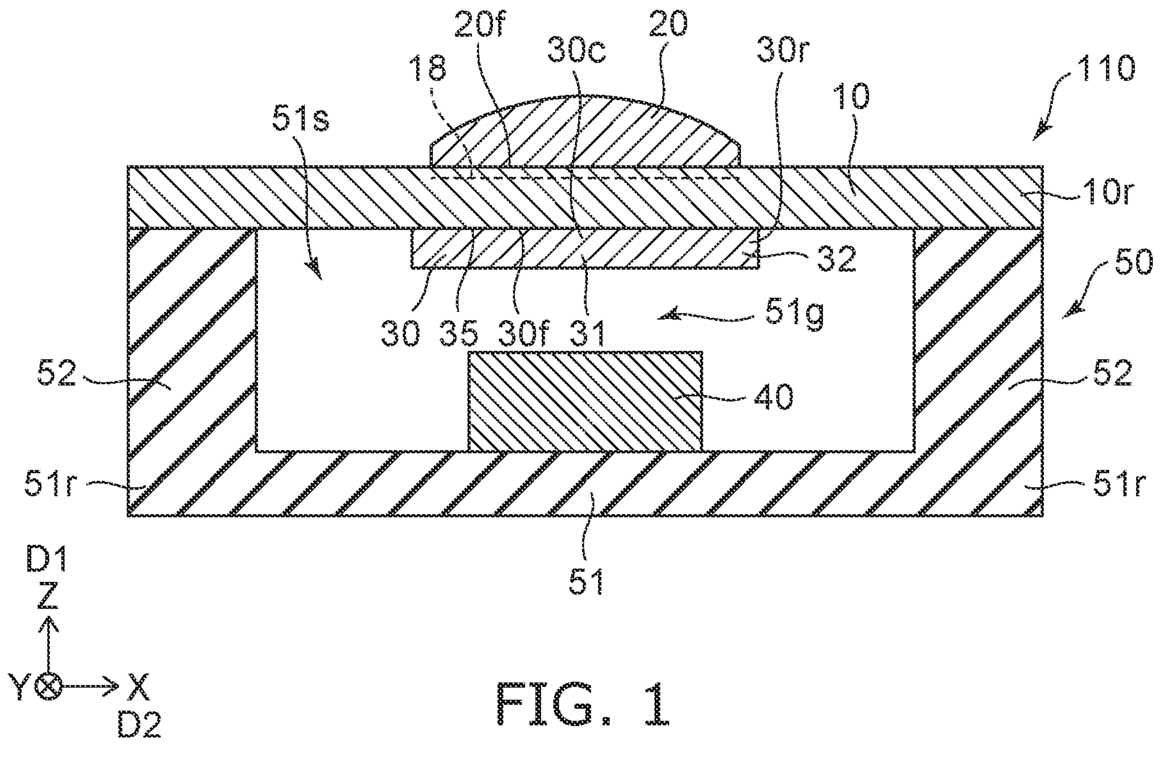
FIG. 1 is a schematic cross-sectional view illustrating an electronic device according to a first embodiment.

According to one embodiment, an electronic device includes a housing, a first member, an electronic element, a getter member, and a second member. The housing includes a first portion. A first gap is provided between the first portion and the first member. A space surrounded by the housing and the first member is sealed at 1 atmospheric pressure or less. The electronic element is provided in the space. The getter member is provided in the space and fixed to the first member. The second member is fixed to the first member. At least a part of the first member is provided between the getter member and the second member. A melting point of the second member is lower than a melting point of the first member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating an electronic device according to a first embodiment.

Figure 2:
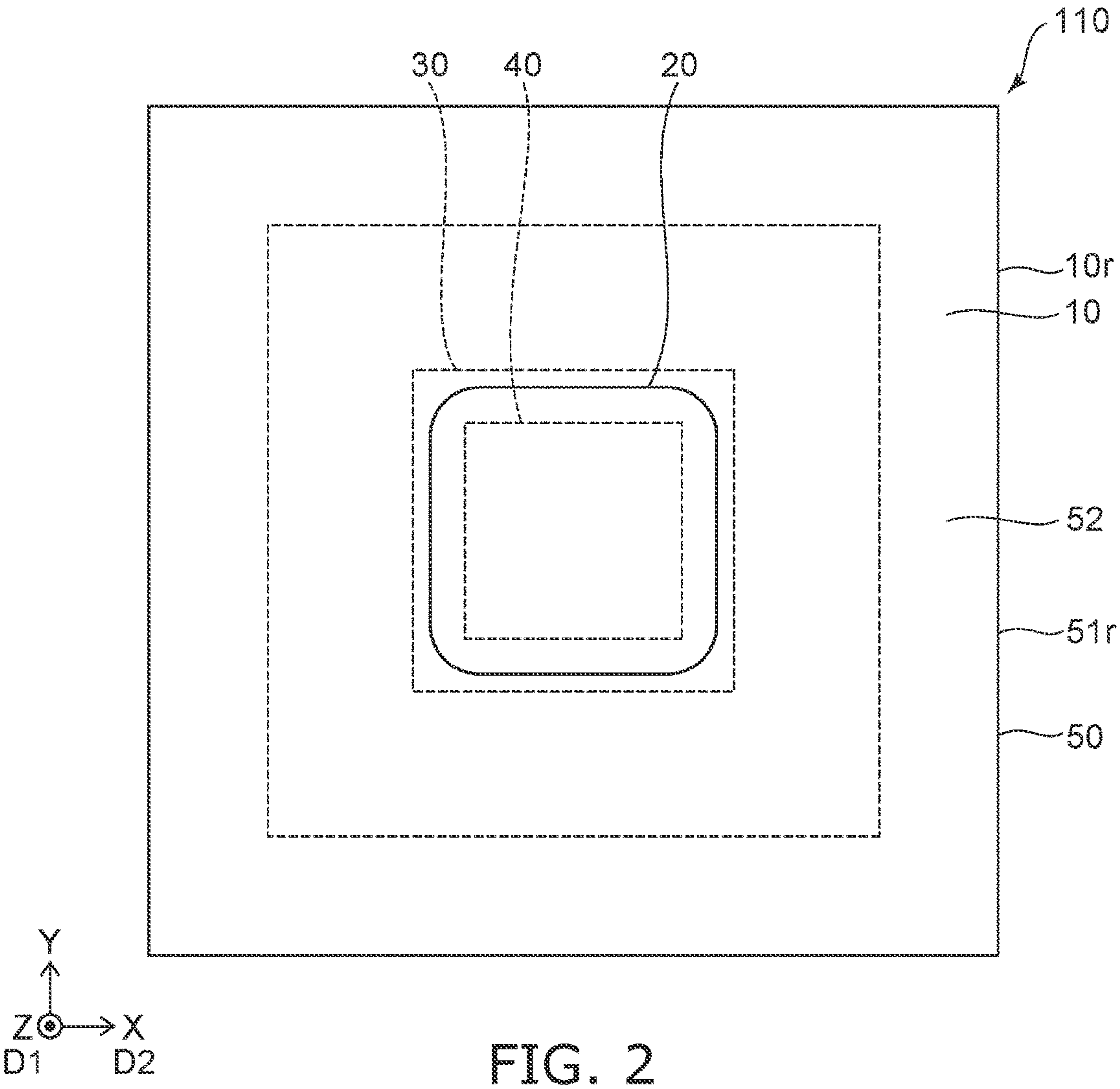
FIG. 2 is a schematic plan view illustrating the electronic device according to the first embodiment.

FIG. 2 is a schematic plan view illustrating the electronic device according to the first embodiment.

As shown in FIGS. 1 and 2, an electronic device 110 according to the embodiment includes a housing 50, a first member 10, an electronic element 40, a getter member 30 and a second member 20.

The housing 50 includes a first portion 51. A first gap 51*g* is provided between the first portion 51 and the first member 10. A space 51*s* surrounded by the housing 50 and the first member 10 is hermetically sealed at 1 atmospheric pressure or less.

In this example, the housing 50 includes side portion 52. The first portion 51 of the housing 50 includes a first outer edge 51*r*. The side portion 52 is provided along the first outer edge 51*r*. The side portion 52 is connected to first portion 51. For example, the side portion 52 is continuous with the first portion 51. The boundary between first portion 51 and side portion 52 may be clear or unclear.

The first member 10 includes a second outer edge 10*r*. The second outer edge 10*r* is connected to the side portion 52. The space 51*s* is surrounded by the first portion 51, the side portion 52 and the first member 10. In the embodiment, it is sufficient that the space 51*s* surrounded by the housing 50 and the first member 10 can be decompressed. The shape of the housing 50 and the shape of the first member 10 are arbitrary. The first member 10 is, for example, a lid.

The electronic element 40 is provided in the space 51*s*. For example, the electronic element 40 is fixed to the first portion 51 in the space 51*s*.

The getter member 30 is provided in the space 51*s*. The getter member 30 is fixed to the first member 10. The getter member 30 is fixed to an inner surface of the first member 10.

The second member 20 is fixed to the first member 10. At least a part of the first member 10 is provided between the getter member 30 and the second member 20. The second member 20 is provided outside the space 51*s*. For example, the second member 20 is fixed to an outer surface of the first member 10.

The melting point of the second member 20 is lower than the melting point of the first member 10. For example, the first member 10 includes a metal with a high melting point. The second member 20 includes a metal with a low melting point.

For example, the second member 20 is heated. When the temperature of the second member 20 becomes higher than the melting point of the second member 20, the second member 20 becomes liquid. The second member 20 being of liquid efficiently adheres to the first member 10. The heat of the second member 20 is efficiently and uniformly transferred to the first member 10. The temperature of the first member 10 rises effectively and uniformly. Thereby, the temperature of the getter member 30 rises uniformly. The getter member 30 efficiently adsorbs a substance in the space 51*s* (for example, nitrogen emitted from the electronic element 40). As a result, the pressure in the space 51*s* is accurately and stably controlled. Change in pressure in the space 51*s* can be suppressed. Thereby, it becomes easier to obtain stable characteristics. For example, in manufacturing, a high yield is obtained.

According to the embodiments, it is possible to provide an electronic device with stable characteristics. According to the embodiment, an electronic device with stable characteristics can be manufactured with high productivity. For example, high yield can be obtained.

In the embodiment, the second member 20 may be heated, for example, by bringing a high temperature member into contact with the second member 20. Alternatively, the second member 20 may be heated by irradiating the second member 20 with an electromagnetic wave such as a laser. In the embodiment, various modifications of the heating method are possible.

For example, a first reference example in which the second member 20 is not provided is conceivable. In the first reference example, the temperature of the getter member 30 is controlled by heating the first member 10. In the first reference example, it is difficult to heat the first member 10 uniformly. When the temperature of the first member 10 rises locally, the temperature of the getter member 30 corresponding to that portion rises excessively locally. In the first reference example, it is difficult to heat the getter member 30 uniformly. Adsorption of substances in the getter member 30 tends to be insufficient. For example, a local excessive temperature rise may destroy the getter member 30 or the first member 10. For example, outgassing may occur from the side portion 52 being overheated.

For example, a second reference example in which a second member 20 having a high melting point is provided can be considered. In the second reference example, the melting point of the second member 20 is equal to or higher than the melting point of the first member 10. In such a second reference example, it is difficult to bring the second member 20 into close contact with the first member 10 stably. Even in the second reference example, it is difficult to heat the getter member 30 uniformly and efficiently. The temperature of the getter member 30 tends to rise excessively locally.

In contrast, in the embodiment, the second member 20 having a low melting point is provided. The second member 20 is heated and becomes liquid. The temperature of the second member 20 being of liquid is uniform. The second member 20 being of liquid can be in contact with the first member 10 with high adhesion. Thereby, the temperature of the first member 10 can be raised uniformly. As a result, the temperature of the getter member 30 can be raised uniformly and stably. In the embodiment, the getter member 30 can adsorb substances with high efficiency. The local excessive temperature rise is suppressed. The destruction of the getter member 30 is suppressed.

In the embodiment, for example, the second member 20 contacts the first member 10. The getter member 30 may, for example, contact the first member 10.

For example, the melting point of the second member 20 may be not less than 150° C. and not more than 500° C. For example, the melting point of the first member 10 may be more than 500° C. and not more than 1600° C.

In one example, the second member 20 includes solder. On the other hand, the first member 10 includes iron, nickel and cobalt. A concentration of nickel in the first member 10 is not less than 28 atomic % and not more than 30 atomic %. A concentration of cobalt in the first member 10 is not less than 15 atomic % and not more than 19 atomic %. The first member 10 may further include at least one selected from the group consisting of silicon and manganese. A low coefficient of thermal expansion, for example, is obtained in the first member 10. For example, high adhesion is easily obtained between the housing 50 and the first member 10. Housing 50 may include ceramic, for example.

A member (for example, a seal ring) made of the same material as the first member 10 may be provided between the first member 10 and the housing 50. For example, the seal ring connects the first member 10 and the housing 50 and seals the interior of the housing 50 (the space 51*s*). For example, the seal ring relieves stress due to expansion of the first member 10.

As shown in FIG. 1, a first direction D1 from the getter member 30 to the second member 20 is defined as the Z-axis direction. One direction perpendicular to the Z-axis direction is defined as an X-axis direction. A direction perpendicular to the Z-axis direction and the X-axis direction is defined as a Y-axis direction. In this example, the first member 10 is plate-like (or layer-like) along the X-Y plane.

As shown in FIG. 1, at least part of the getter member 30 may be provided between the electronic element 40 and the second member 20 in the first direction D1. For example, substances emitted from the electronic element 40 are efficiently adsorbed on the getter member 30.

As shown in FIGS. 1 and 2, the getter member 30 overlaps the second member 20 in the first direction D1.

In the embodiment, the shape of the getter member 30 in the X-Y plane is arbitrary. The shape of the second member 20 in the X-Y plane is arbitrary. The area of the second member 20 may be similar to the area of the getter member 30.

As shown in FIG. 1, the getter member 30 includes a first face 30*f*. The first face 30*f* faces the first member 10. The second member 20 includes a second face 20*f*. The second face 20*f* faces the first member 10. A first area of the first face 30*f* may be not less than 0.5 tomes and not more than 2 times a second area of the second face 20*f*. By the getter member 30 and the second member 20 having similar areas to each other, it is easy to heat the getter member 30 uniformly. The second area may be larger than the first area.

A face of the first member 10 corresponding to the second member 20 may include a film portion 18. The film portion 18 improves wettability or adhesion of the second member 20 being melted, for example. The film portion 18 promotes spreading of the second member 20 being melted. The film portion 18 may suppress the second member 20 being melted from flowing out. The area of the second member 20 is adjusted by the film portion 18. The area of the getter member 30 and the area of the second member 20 may be adjusted to the same degree by the film portion 18. Heat may be effectively propagated by the film portion 18. The film portion 18 may be a surface-treated region.

The first face 30*f* of the getter member 30 may include an overlapping region 35. The overlapping region 35 overlaps the second member 20 in the first direction D1 from the getter member 30 to the second member 20. An area of the overlapping region 35 may be, for example, not less than 0.5 times and not more than 1 time the first area of the first face 30*f*. For example, all of the first face 30*f* of the getter member 30 may overlap the second member 20 in the first direction D1. For example, half or more of the first face 30*f* of the getter member 30 may overlap the second member 20 in the first direction D1.

The size of the getter member 30 in the X-Y plane may be larger, smaller, or the same as the size of the electronic element 40 in the X-Y plane.

In the embodiment, the temperature of the getter member 30 can rise relatively uniformly. In the embodiment, there may be some variation in the temperature of the getter member 30. For example, the temperature of the peripheral portion of the getter member 30 may be lower than the temperature of the central portion of the getter member 30.

As shown in FIG. 1, for example, the getter member 30 includes a first region 31 and a second region 32. A direction from the first region 31 to the second region 32 is along the second direction D2. The second direction D2 crosses the first direction D1 from the getter member 30 to the second member 20. The second direction D2 may be one direction (for example, the X-axis direction) along the X-Y plane.

The first region 31 includes a center 30*c* of the getter member 30 on a plane (X-Y plane) crossing the first direction D1. The second region 32 includes an outer edge 30*r* of the getter member 30 in this plane. For example, a nitrogen concentration in the first region 31 is higher than a nitrogen concentration in the second region 32. Alternatively, the second region 32 does not include nitrogen. For example, temperature differences in the getter member 30 may change the adsorption properties, resulting in the nitrogen concentrations.

In the embodiment, the getter member 30 includes, for example, at least one selected from the group consisting of titanium, zirconium, vanadium, iron, cobalt, aluminum, and rare earths. A high adsorption property is obtained in the getter member 30.

In the embodiment, the pressure of the space 51*s* is, for example, 1 Pa or less. Low pressure can be stably obtained.

Figure 3:
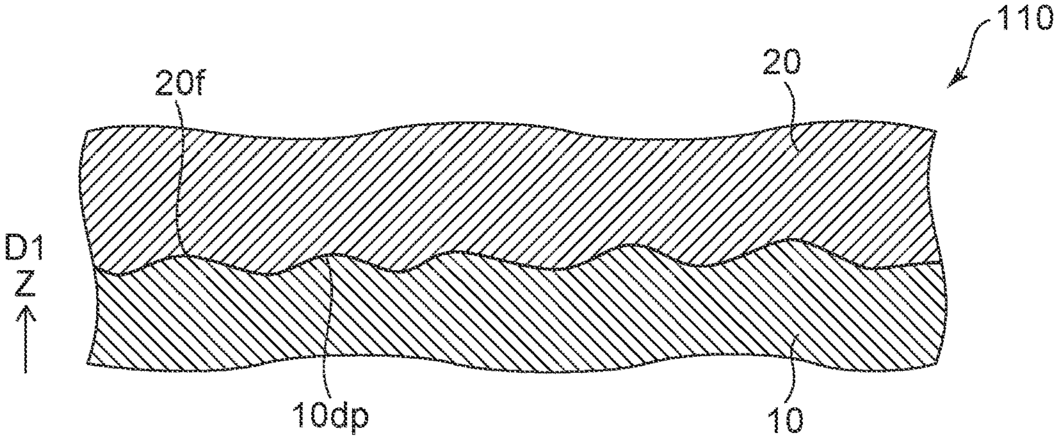
FIG. 3 is a schematic cross-sectional view illustrating the electronic device according to the first embodiment.

FIG. 3 is a schematic cross-sectional view illustrating the electronic device according to the first embodiment.

FIG. 3 is an enlarged view illustrating the first member 10 and the second member 20. As shown in FIG. 3, unevenness 10*dp* may be provided on the surface of the first member 10. The second face 20*f* of the second member 20 may be in contact with the surface of the first member 10. In the manufacturing process, the temperature of the second member 20 becomes equal to or higher than the melting point of the second member 20. The second member 20 being of liquid contacts the surface of the first member 10 with high adhesion. As it cools, the second member 20 becomes solid. In the second member 20 being of liquid, the second face 20*f* may be along the unevenness 10*dp* of the first member 10. High characteristics can be stably obtained.

Figure 4:
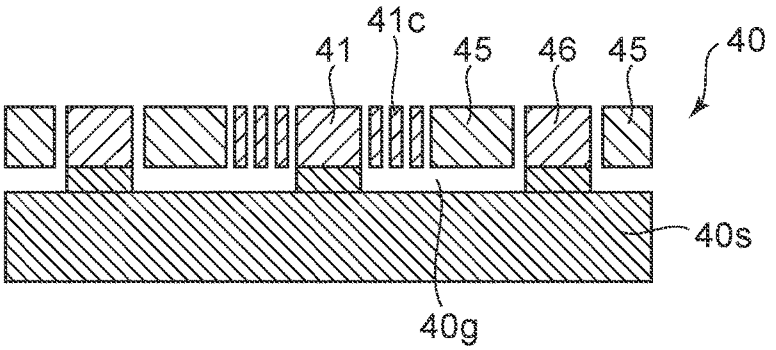
FIG. 4 is a schematic cross-sectional view illustrating a part of the electronic device according to the first embodiment.

FIG. 4 is a schematic cross-sectional view illustrating a part of the electronic device according to the first embodiment.

FIG. 4 illustrates the electronic element 40 included in the electronic device 110. As shown in FIG. 4, the electronic element 40 includes a base 40*s*, a support portion 41 and a movable portion 45. The support portion 41 is fixed to the base 40*s*. The movable portion 45 is supported by the support portion 41. In this example, the movable portion 45 is supported by a connect portion 41*c* connected to the support portion 41. The connect portion 41*c* is, for example, a spring portion. A second gap 40*g* is provided between the base 40*s* and the movable portion 45.

As shown in FIG. 4, an electrode 46 fixed to the base 40*s* may be provided. A voltage applied to the electrode 46 may cause the movable portion 45 to vibrate. A vibration state of the movable portion 45 may change according to the force applied from the outside. A change in the vibration state of the movable portion 45 may be detected by the electrode 46. The electronic element 40 is, for example, an inertial sensor.

In the embodiment, the electronic element 40 is arbitral. The electronic element 40 may include various sensors. The electronic element 40 may include, for example, a high frequency circuit. The electronic element 40 may include an oscillator device. The electronic element 40 may include a crystal element.

Second Embodiment

The second embodiment relates to an electronic device manufacturing apparatus.

Figure 5:
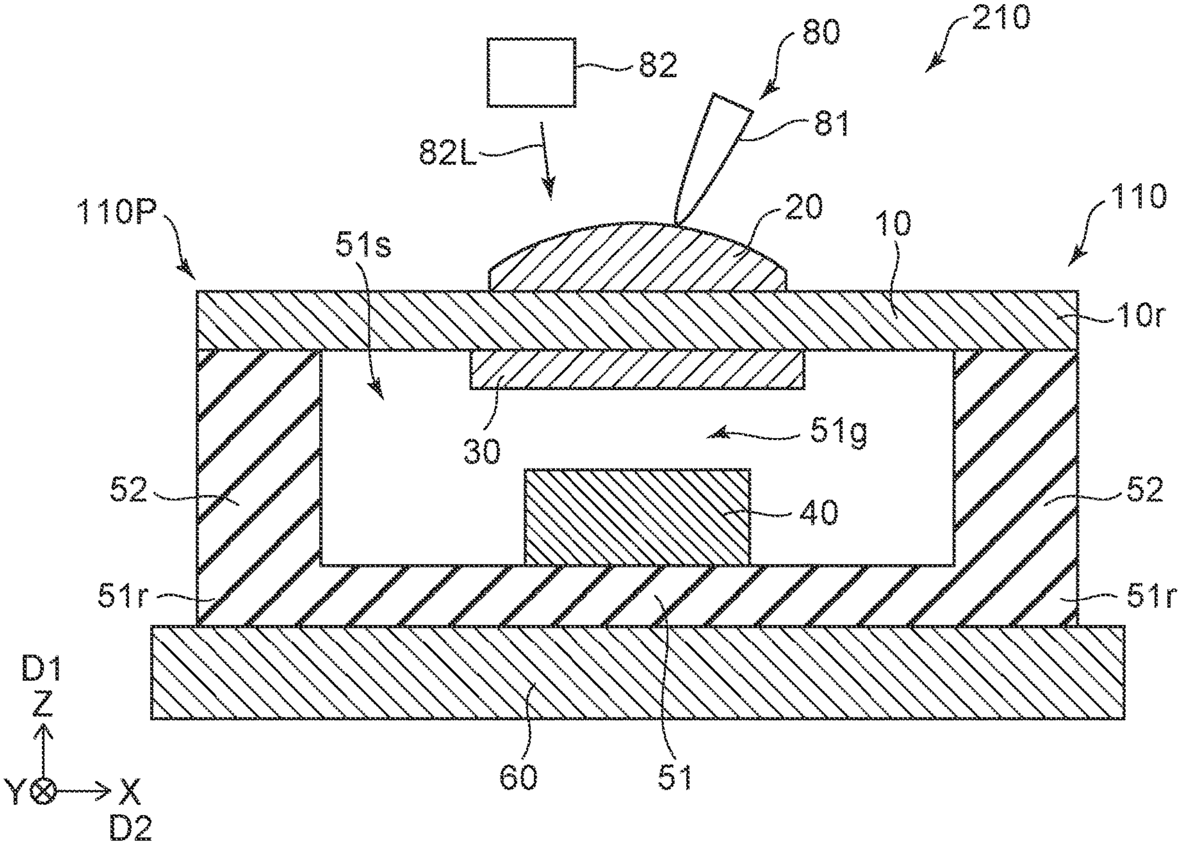
FIG. 5 is a schematic cross-sectional view illustrating an electronic device manufacturing apparatus according to a second embodiment.

FIG. 5 is a schematic cross-sectional view illustrating an electronic device manufacturing apparatus according to the second embodiment.

As shown in FIG. 5, an electronic device manufacturing apparatus 210 according to the embodiment includes a cooling portion 60 and a heating portion 80. It is possible to place the electronic device 110 in the cooling portion 60.

The electronic device 110 has the configuration described with respect to the first embodiment. The cooling portion 60 is configured to cool at least a part of the housing 50. The heating portion 80 portion heat the second member 20 to the melting point of the second member 20 or higher. By heating the second member 20, the second member 20 being of liquid contacts the first member 10 with high adhesion. The temperature of the first member 10 rises uniformly, and the temperature of the getter member 30 rises uniformly and efficiently. Electronic devices with stable characteristics can be manufactured with high productivity. For example, high yield can be obtained.

The heating portion 80 includes, for example, a high temperature member 81. The high temperature member 81 may be heated by Joule heat, for example. The contact of the high temperature member 81 with the second member 20 causes the temperature of the second member 20 to become equal to or higher than the melting point of the second member 20.

The heating portion 80 may include an electromagnetic wave irradiator 82, for example. The electromagnetic wave irradiator 82 is configured to irradiate the second member 20 with an electromagnetic wave 82L (for example, laser light).

The cooling portion 60 is configured to cool the first portion 51, for example. The first portion 51 is located between the cooling portion 60 and the electronic element 40. The electronic element 40 can be efficiently cooled.

The cooling portion 60 may include, for example, a water-cooled cooling mechanism, an air-cooled cooling mechanism, or a solid-state cooling mechanism (such as a Peltier element). The temperature of the cooling portion 60 may be, for example, 15° C. or lower (e.g., 5° C. or lower).

Third Embodiment

The third embodiment relates to a method of manufacturing an electronic device. FIG. 5 above illustrates the method of manufacturing the electronic device.

In the manufacturing method according to the embodiment, an electronic device component 110P to be the electronic device 110 is prepared. The electronic device component 110P includes the housing 50, the first member 10, the electronic element 40, the getter member 30 and the second member 20. The housing 50 includes the first portion 51. The first gap 51*g* is provided between the first portion 51 and the first member 10. The space 51*s* surrounded by the housing 50 and the first member 10 is hermetically sealed at 1 atmospheric pressure or less. The electronic element 40 is provided in the space 51*s*. The getter member 30 is provided in the space 51*s* and fixed to the first member 10. The second member 20 is fixed to the first member 10. At least a part of the first member 10 is provided between the getter member 30 and the second member 20. The melting point of the second member 20 is lower than the melting point of the first member 10.

In the manufacturing method according to the embodiment, the second member 20 is heated to the melting point of the second member 20 or higher. According to the embodiment, an electronic device with stable characteristics can be manufactured with high productivity. For example, high yield can be obtained.

The embodiments may include the following configurations (for example, technical proposals).

Configuration 1

An electronic device, comprising:

a housing including a first portion;

a first member, a first gap being provided between the first portion and the first member, a space surrounded by the housing and the first member being sealed at 1 atmospheric pressure or less;

an electronic element provided in the space;

a getter member provided in the space and fixed to the first member; and a second member fixed to the first member, at least a part of the first member being provided between the getter member and the second member, a melting point of the second member being lower than a melting point of the first member.

Configuration 2

The electronic device according to Configuration 1, wherein the second member is in contact with the first member.

Configuration 3

The electronic device according to Configuration 2, wherein the getter member is in contact with the first member.

Configuration 4

The electronic device according to any one of Configurations 1-3, wherein the melting point of the second member is not less than 150° C. and not more than 500° C., and the melting point of the first member is more than 500° C. and not more than 1600° C.

Configuration 5

The electronic device according to any one of Configurations 1-4, wherein the first member includes a metal, and the second member includes a metal.

Configuration 6

The electronic device according to any one of Configurations 1-4, wherein the second member includes solder.

Configuration 7

The electronic device according to Configuration 6, wherein the first member includes iron, nickel and cobalt.

Configuration 8

The electronic device according to Configuration 7, wherein a concentration of nickel in the first member is not less than 28 atomic % and not more than 30 atomic %, and a concentration of cobalt in the first member is not less than 15 atomic % and not more than 19 atomic %.

Configuration 9

The electronic device according to Configuration 8, wherein the first member further includes at least one selected from the group consisting of silicon and manganese.

Configuration 10

The electronic device according to any one of Configurations 1-9, wherein at least a part of the getter member is located between the electronic element and the second member in a first direction from the getter member to the second member.

Configuration 11

The electronic device according to any one of Configurations 1-10, wherein the getter member includes a first face facing the first member, the second member includes a second face facing the first member, and a first area of the first face is not less than 0.5 times and not more than 2 times a second area of the second face.

Configuration 12

The electronic device according to any one of Configurations 1-9, wherein the getter member includes a first face facing the first member, the first face includes an overlapping region overlapping the second member in a first direction from the getter member to the second member, and an area of the overlapping region is not less than 0.5 times and not more than 1 time a first area of the first face.

Configuration 13

The electronic device according to any one of Configurations 1-12, wherein the getter member includes at least one selected from the group consisting of titanium, zirconium, vanadium, iron, cobalt, aluminum and rare earth elements.

Configuration 14

The electronic device according to any one of Configurations 1-9, wherein the getter member includes a first region and a second region, a direction from the first region to the second region is along a second direction crossing a first direction from the getter member to the second member, the first region includes a center of the getter member on a plane crossing the first direction, the second region includes an outer edge of the getter member in the plane, and a concentration of nitrogen in the first region is higher than a concentration of nitrogen in the second region, or the second region does not include nitrogen.

Configuration 15

The electronic device according to any one of Configurations 1-13, wherein the first portion includes a first outer edge, the housing includes a side portion provided along the first outer edge and connected to the first portion, the first member includes a second outer edge connected to the side, and the space is surrounded by the first portion, the side portion and the first member.

Configuration 16

The electronic device according to any one of Configurations 1-15, wherein the electronic element includes a base, a support portion fixed to the base, and a movable portion supported by the support portion, a second gap is provided between the base and the movable portion.

Configuration 17

The electronic device according to any one of Configurations 1-16, wherein a pressure of the space is 1 Pa or less.

Configuration 18

An electronic device manufacturing apparatus, comprising:

a cooling portion; and a heating portion, an electronic device including:

a housing including a first portion, a first member, a first gap being provided between the first portion and the first member, a space surrounded by the housing and the first member being sealed at 1 atmospheric pressure or less, an electronic element provided in the space, a getter member provided in the space and fixed to the first member, and a second member fixed to the first member, at least a part of the first member being provided between the getter member and the second member, a melting point of the second member being lower than a melting point of the first member, the cooling portion being configured to cool at least a part of the housing, and the heating portion being configured to heat the second member to a temperature equal to or higher than the melting point of the second member.

Configuration 19

The electronic device manufacturing apparatus according to Configuration 18, wherein the cooling portion is configured to cool the first portion, and the first portion is provided between the cooling portion and the electronic element.

Configuration 20

A method for manufacturing an electronic device, the method comprising:

preparing an electronic device component, the electronic device component including:

a housing including a first portion, a first member, a first gap being provided between the first portion and the first member, a space surrounded by the housing and the first member being sealed at 1 atmospheric pressure or less, an electronic element provided in the space, a getter member provided in the space and fixed to the first member, and a second member fixed to the first member, at least a part of the first member being provided between the getter member and the second member, a melting point of the second member being lower than a melting point of the first member; and heating the second member to the melting point of the second member, or more.

According to the embodiments, it is possible to provide an electronic device, an electronic device manufacturing apparatus, and a method for manufacturing an electronic device that can provide stable characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electronic devices such as housings, members, electronic elements, getter members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic devices, electronic device manufacturing apparatuses, and methods for manufacturing electronic devices practicable by an appropriate design modification by one skilled in the art based on the electronic devices, the electronic device manufacturing apparatuses, and the methods for manufacturing electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic device, comprising:

a housing including a first portion;

a first member, a first gap being provided between the first portion and the first member, a space surrounded by the housing and the first member being sealed at 1 atmospheric pressure or less;

an electronic element provided in the space;

a getter member provided in the space and fixed to the first member; and a second member fixed to the first member, at least a part of the first member being provided between the getter member and the second member, a melting point of the second member being lower than a melting point of the first member, wherein the second member includes solder, the first member includes iron, nickel and cobalt, a concentration of nickel in the first member is not less than 28 atomic % and not more than 30 atomic %, and a concentration of cobalt in the first member is not less than 15 atomic % and not more than 19 atomic %.

2. The device according to claim 1, wherein the second member is in contact with the first member.

3. The device according to claim 1, wherein the getter member is in contact with the first member.

4. The device according to claim 1, wherein the melting point of the second member is not less than 150° C. and not more than 500° C., and the melting point of the first member is more than 500° C. and not more than 1600° C.

5. The device according to claim 1, wherein the first member further includes at least one selected from the group consisting of silicon and manganese.

6. The device according to claim 1, wherein at least a part of the getter member is located between the electronic element and the second member in a first direction from the getter member to the second member.

7. The device according to claim 1, wherein the getter member includes a first face facing the first member, the second member includes a second face facing the first member, and a first area of the first face is not less than 0.5 times and not more than 2 times a second area of the second face.

8. The device according to claim 1, wherein the getter member includes a first face facing the first member, the first face includes an overlapping region overlapping the second member in a first direction from the getter member to the second member, and an area of the overlapping region is not less than 0.5 times and not more than 1 time a first area of the first face.

9. The device according to claim 1, wherein the getter member includes at least one selected from the group consisting of titanium, zirconium, vanadium, iron, cobalt, aluminum and rare earth elements.

10. The device according to claim 1, wherein the first portion includes a first outer edge, the housing includes a side portion provided along the first outer edge and connected to the first portion, the first member includes a second outer edge connected to the side, and the space is surrounded by the first portion, the side portion and the first member.

11. The device according to claim 1, wherein the electronic element includes a base, a support portion fixed to the base, and a movable portion supported by the support portion, a second gap is provided between the base and the movable portion.

12. The device according to claim 1, wherein a pressure of the space is 1 Pa or less.

13. An electronic device, comprising:

a housing including a first portion;

a first member, a first gap being provided between the first portion and the first member, a space surrounded by the housing and the first member being sealed at 1 atmospheric pressure or less;

an electronic element provided in the space;

a getter member provided in the space and fixed to the first member; and a second member fixed to the first member, at least a part of the first member being provided between the getter member and the second member, a melting point of the second member being lower than a melting point of the first member wherein the getter member includes a first region and a second region, a direction from the first region to the second region is along a second direction crossing a first direction from the getter member to the second member, the first region includes a center of the getter member on a plane crossing the first direction, the second region includes an outer edge of the getter member in the plane, and a concentration of nitrogen in the first region is higher than a concentration of nitrogen in the second region, or the second region does not include nitrogen.

14. A method for manufacturing an electronic device, the method comprising:

preparing an electronic device component, the electronic device component including:

a housing including a first portion, a first member, a first gap being provided between the first portion and the first member, a space surrounded by the housing and the first member being sealed at 1 atmospheric pressure or less, an electronic element provided in the space, a getter member provided in the space and fixed to the first member, and a second member fixed to the first member, at least a part of the first member being provided between the getter member and the second member, a melting point of the second member being lower than a melting point of the first member; and heating the second member to the melting point of the second member, or more.

* * * * *